United States Patent [19]
Douglas et al.

[11] Patent Number: 5,868,862
[45] Date of Patent: Feb. 9, 1999

[54] METHOD OF REMOVING INORGANIC CONTAMINATION BY CHEMICAL ALTERATION AND EXTRACTION IN A SUPERCRITICAL FLUID MEDIA

[75] Inventors: Monte A. Douglas, Coppell; Allen C. Templeton, Princeton, both of Tex.

[73] Assignee: Texas Instruments Incorporated, Dallas, Tex.

[21] Appl. No.: 903,907

[22] Filed: Jul. 31, 1997

Related U.S. Application Data

[60] Provisional application No. 60/022,913, Aug. 1, 1996.

[51] Int. Cl.$^6$ ........................................ B08B 3/00
[52] U.S. Cl. ........................... 134/26; 134/1; 134/2; 134/1.3; 134/21; 134/28; 134/29; 134/31; 134/36; 134/902; 438/745; 438/753; 438/756; 438/749; 438/902
[58] Field of Search ........................ 134/1.3, 1, 3, 2, 134/26, 28, 29, 36, 21, 31, 902; 438/745, 753, 756, 902, 749

[56] References Cited

U.S. PATENT DOCUMENTS

| | | | |
|---|---|---|---|
| 4,475,993 | 10/1984 | Blander et al. | 204/64 |
| 4,749,440 | 6/1988 | Blackwood et al. | 134/1.3 |
| 4,923,828 | 5/1990 | Gluck et al. | 432/225 |
| 5,105,556 | 4/1992 | Kurokawa et al. | 34/12 |
| 5,225,173 | 7/1993 | Wai | 423/2 |
| 5,261,965 | 11/1993 | Moslehi | 134/1 |
| 5,274,129 | 12/1993 | Natale et al. | 549/349 |
| 5,290,361 | 3/1994 | Hayashida et al. | 134/2 |
| 5,316,591 | 5/1994 | Chao | 134/34 |
| 5,352,327 | 10/1994 | Witowski | 156/646 |
| 5,377,705 | 1/1995 | Smith, Jr. et al. | 134/95.3 |
| 5,401,322 | 3/1995 | Marshall | 134/1 |
| 5,417,768 | 5/1995 | Smith, Jr. et al. | 134/26 |
| 5,470,393 | 11/1995 | Fulcazawa | 134/3 |
| 5,494,526 | 2/1996 | Parenjpe | 134/1 |
| 5,501,761 | 3/1996 | Evans et al. | 134/1.3 |
| 5,522,938 | 6/1996 | O'Brien | 134/1 |
| 5,550,211 | 8/1996 | DeCroste et al. | 528/480 |
| 5,580,846 | 12/1996 | Hayashida et al. | 510/175 |
| 5,635,463 | 6/1997 | Muraoke | 510/175 |
| 5,637,151 | 6/1997 | Scholz | 134/26 |
| 5,656,097 | 8/1997 | Olesen et al. | 134/1 |
| 5,679,121 | 10/1997 | Saga et al. | 134/3 |
| 5,679,169 | 10/1997 | Gonzales et al. | 134/1.3 |

FOREIGN PATENT DOCUMENTS

| | | |
|---|---|---|
| 01204427 | 8/1989 | European Pat. Off. . |
| 0 391 035 A2 | 2/1990 | European Pat. Off. . |
| 0 536 752 A2 | 10/1992 | European Pat. Off. . |
| 06196472 | 7/1994 | European Pat. Off. . |

OTHER PUBLICATIONS

International Journal of Environmental Conscious Design & Manufacturing, vol. 2 No. 1. pp. 81–86 1993. (p. 83).
Journal of the American Ceramic Society—Matson and Smith, vol. 72, No. 6, pp. 872–874.

*Primary Examiner*—Jill Warden
*Assistant Examiner*—S. Carrillo
*Attorney, Agent, or Firm*—Mark A. Valetti; Carl H. Hoel; Richard L. Donaldson

[57] ABSTRACT

A method of removing inorganic contamination (contamination 104 of FIGS. 2*a*–2*b*) from a layer (layer 102) overlying a substrate (substrate 100), the method comprising the steps of: removing the layer overlying the substrate with at least one removal agent; reacting the inorganic contamination with at least one conversion agent, thereby converting the inorganic contamination; removing the converted inorganic contamination by subjecting it to at least one solvent agent, the solvent agent included in a first supercritical fluid; and wherein the converted inorganic contamination is more highly soluble in the solvent agent than the inorganic contamination.

17 Claims, 1 Drawing Sheet

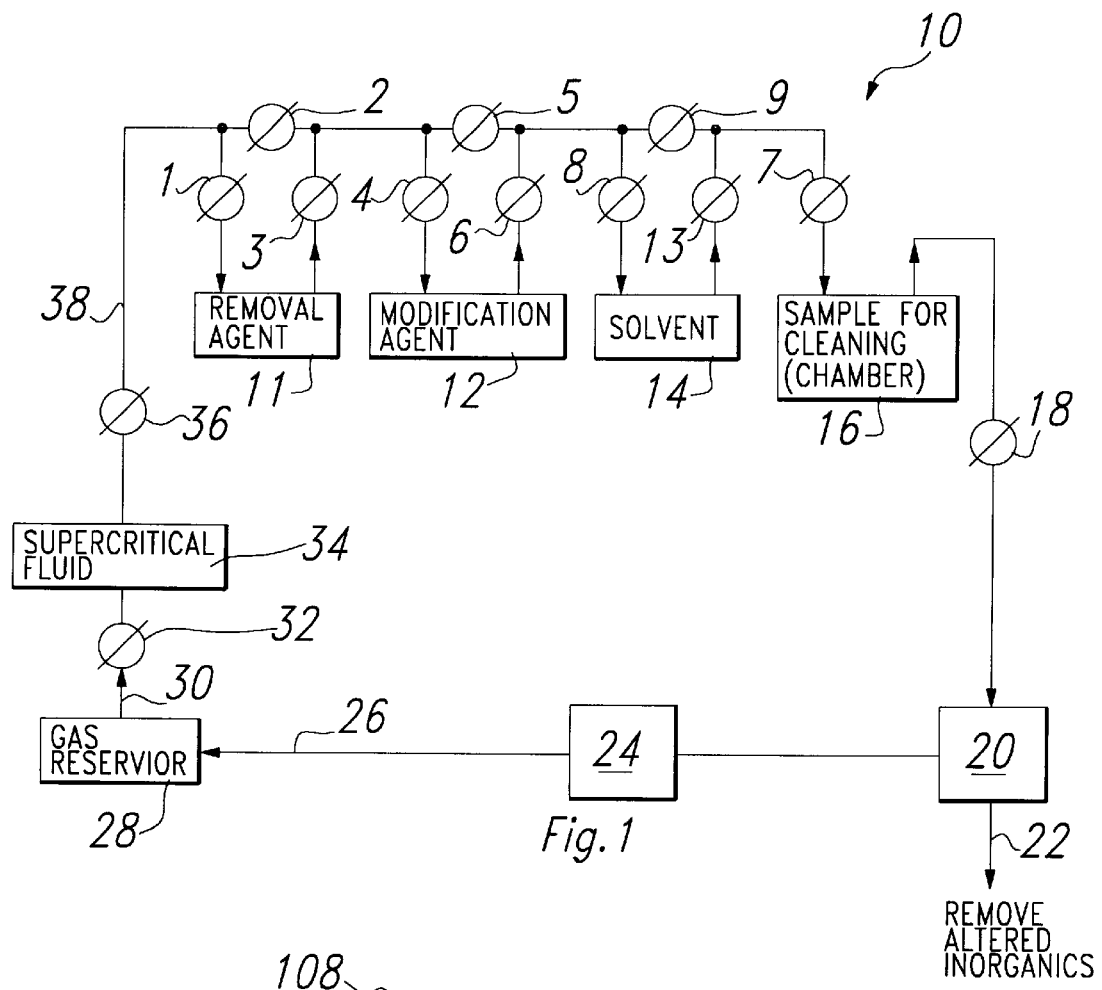

METHOD OF REMOVING INORGANIC CONTAMINATION BY CHEMICAL ALTERATION AND EXTRACTION IN A SUPERCRITICAL FLUID MEDIA

This Application claims priority under 35 U.S.C. 119(e)(1) of provisional application Ser. No. 60/022,913 filed on Aug. 1, 1996.

CROSS-REFERENCE TO RELATED PATENT/PATENT APPLICATIONS

The following commonly assigned patent/patent applications are hereby incorporated herein by reference:

| U.S. Pat. No. /Ser. No. | Filing Date | TI Case No. |
| --- | --- | --- |
| 08/898936 | 7/23/1996 | TI-21081 |

1. Field of the Invention

The instant invention pertains to semiconductor device fabrication and processing and more specifically to a method of removing inorganic contamination in a supercritical fluid media.

2. Background of the Invention

In the manufacture of, for example, integrated circuits and liquid crystal displays, contamination of the substrate and subsequent semiconductor layers causes many problems and should be reduced as much as possible. Examples of such contamination are residual particulates, organics, and metals. In addition, contaminants may be situated on the surface of the semiconductor layer, or they may be situated between the semiconductor layer and another layer (e.g. an oxide layer). Typically, wet-processing is utilized in the fabrication of semiconductor devices. A wet cleaning process may consist of a sequence of particle removal and metal removal steps, with a rinsing step performed between them, and concluding with a drying step. Drying is typically accomplished either by spinning the wafer so that the liquid on the wafer will be spun off or by raising the wafers from a cloud of hot isopropyl alcohol vapor which condenses on the surface of the wafer and displaces the water.

This type of wet cleaning process suffers from a particularly serious drawback, specifically, most metal removal processes of this type (typically consisting of strongly acidic mixtures) add particles to the surface of the wafer, and particle removal processes (typically comprised of basic/oxidant mixtures) add metals to the surface of the wafer. In addition, most wet cleaning processes suffer from the problems of: expense of obtaining electronic-grade wet chemicals; expense of disposing of the caustic chemicals which are used in wet cleaning processes; liquid surface tension limiting or preventing access of wet chemical cleaning to high aspect ratio features, like trenches; and lack of harmonization with all dry processing (which is utilized more frequently in semiconductor processing). Hence, a metal removal step followed by a particle removal step will result in residual metals, while the reverse process results in fewer particles but can become contaminated with metals by the final rinsing.

Supercritical fluids (namely, supercritical carbon dioxide) have received much attention, lately. This is especially true in the area's involving decaffeination of coffee and linen/fine clothing dry cleaning. In addition, supercritical $CO_2$ can be used in the removal of organic contaminates from semiconductor wafers. See *International Journal of Environmentally Conscious Design & Manufacturing*, Vol. 2, p. 83 (1993) (stating "[s]upercritical carbon dioxide is best applied to the removal of organic compounds with mid-to-low volatilities"). However, supercritical $CO_2$ is generally regarded as ineffective in cleaning inorganic contaminants (namely, metals) from semiconductor wafers.

Relating to another field, a group of researchers have discovered a way of removing metals from vegetation by subjecting the vegetation to supercritical $CO_2$ and neutralizing the metals with chelating agents. See Elizabeth K. Wilson, *Toxic Metals Extracted with Supercritical Carbon Dioxide*, C&EN 27 (Apr. 15, 1996); and U.S. Pat. No. 5,356,538. However, this work states that "[b]y itself, non-polar supercritical $CO_2$ is almost useless for solvating positively charged heavy-metal ions. However, researchers have discovered that metals can be solvated if they are first neutralized by chelating agents and, furthermore, that the solvency increases dramatically when the chelating agents are fluorinated." Id. at 27. However, there are several problems with this approach. First, there is a difficulty removing uncharged metals. Second, unfluorinated chelating agents are expensive. Third, mass scale synthesis of fluorinated chelating agents is expensive. Fourth, fluorinated and unfluorinated chelating agents are highly toxic and expensive to purify and dispose of Fifth, there is a limited range of metals that can be readily solvated by the fluorinated chelating agents. Sixth, diffusion of unchelated metals into an underlying semiconductor substrate would be disastrous using the methodology of this publication.

It is, therefore, an object of the instant invention to provide a method of removing metal contaminants from between a native oxide layer and a semiconductor wafers. It is another object of the instant invention to provide a method of removing inorganic contaminants from between a native oxide layer and semiconductor wafers.

SUMMARY OF THE INVENTION

In summary, one embodiment of the instant invention is a method which overcomes the problems involved with chemical modification of the ionic and neutral, light and heavy inorganic (metal) species and which renders these ionic and neutral, light and heavy inorganic (metal) species soluble upon exposure to conventional, inexpensive, high purity, nontoxic solvents. The method of the instant invention includes the steps of: removing the native oxide in which overlies the inorganic contamination (and/or that is situated between the inorganic contamination and the substrate and/or that surrounds the inorganic contamination), thereby exposing the inorganic contamination (that is contained within the native oxide or that underlies the native oxide); chemically altering the inorganic contamination; exposing the chemically-altered inorganic contaminant to a conventional solvent which is included in a supercritical fluid (preferably supercritical $CO_2$); and removing the conventionally-solvated, chemically-altered inorganic contaminant in a supercritical fluid (SCF). The chemical altering of the inorganic contaminant may occur prior to or during the exposure to the SCF. Key aspects of this invention are: inorganic contamination within a native oxide is exposed for subsequent modification and removal; the inorganic contaminant is not soluble in the supercritical $CO_2$ fluid without prior chemical alteration; and the chemically-altered inorganic contaminant may be removed by the solvent simultaneously with the chemical alteration step.

An embodiment of the instant invention is a method of removing inorganic contamination from a layer overlying a substrate, the method comprising the steps of: removing the layer overlying the substrate with at least one removal agent; reacting the inorganic contamination with at least one conversion agent, thereby converting the inorganic contamination; removing the converted inorganic contamination by subjecting it to at least one solvent agent, the solvent agent included in a first supercritical fluid; and wherein the converted inorganic contamination is more highly soluble in the solvent agent than the inorganic contamination. Preferably, the conversion agent is selected from the group consisting of: an acid agent, a basic agent, a chelating agent, a ligand agent, a halogen-containing agent, and any combination thereof More preferably, the conversion agent is comprised of HF and is included in supercritical $CO_2$. Preferably, the solvent agent is selected from the group consisting of: a polar gas, a nonpolar gas, a polar supercritical fluid, a nonpolar supercritical fluid, a polar species, a nonpolar species, a surfactants, a detergent, a amphoteric material, or a chelating agent, and the solvent agent is included in supercritical $CO_2$. The overlying layer may be comprised of a native oxide. The steps of removing the layer overlying the substrate with a removal agent and reacting the inorganic contamination with a conversion agent may be performed simultaneously. Alternatively, the steps of removing the layer overlying the substrate with a removal agent, reacting the inorganic contamination with a conversion agent, and removing the converted inorganic contamination are performed simultaneously; or the step of removing the layer overlying the substrate with a removal agent is performed followed by the steps of reacting the inorganic contamination with a conversion agent and removing the converted inorganic contamination, which are performed simultaneously. Preferably, the removal agent is comprised of HF, and it is included in a second supercritical fluid. The second supercritical fluid is, preferably, comprised of supercritical $CO_2$.

Another embodiment of the instant invention is a method of removing inorganic contamination from a layer overlying a substrate, the method comprising the steps of: removing the layer overlying the substrate with at least one removal agent, the removal agent included in a first supercritical fluid; reacting the inorganic contamination with at least one conversion agent thereby converting the inorganic contamination, the conversion agent included in a second supercritical fluid; removing the converted inorganic contamination by subjecting it to at least one solvent agent, the solvent agent included in a third supercritical fluid; and wherein the converted inorganic contamination is more highly soluble in the solvent agent than the inorganic contamination. The steps of removing the layer overlying the substrate with a removal agent and reacting the inorganic contamination with a conversion agent may be performed simultaneously. However, the steps of removing the layer overlying the substrate with a removal agent, reacting the inorganic contamination with a conversion agent, and removing the converted inorganic contamination may all be performed simultaneously. Alternatively, the step of removing the layer overlying the substrate with a removal agent is performed followed by the steps of reacting the inorganic contamination with a conversion agent and removing the converted inorganic contamination, which are performed simultaneously.

BRIEF DESCRIPTION OF THE DRAWINGS

FIG. 1 is a schematic drawing of a sample cleaning system in accordance with an embodiment of the instant invention.

FIGS. 2a–2d are cross sectional views illustrating an embodiment of the instant invention.

DETAILED DESCRIPTION OF THE INSTANT INVENTION

FIG. 1 illustrates a process system which can be utilized to implement the method of the instant invention. The sample to be cleaned (the semiconductor wafer with inorganic contamination present) is held in container 16. A supercritical fluid (preferably a $CO_2$ gas) is supplied from a gas reservoir 28 which is connected by conduit 30, which includes valve 32, to a pressurization unit 34 that increases the pressure on the gas to greater than approximately 70 to 75 atmospheres at a temperature greater than approximately 32° C. to form the supercritical fluid. The supercritical fluid (SCF) travels through valve 36 and conduit 38 to a reservoir 11 (as long as valves 1 and 3 are open and valve 2 is closed) that holds a solid, liquid, or gas removal agent(s). Possible removal agents are listed below. The passing of the SCF through the removal agent acts to incorporate the modification agent into the SCF. The SCF incorporated with the removal agent leaves reservoir 11 and enters container 16. The SCF mixture and inorganic contamination are introduced, resulting in the removal of the top layer containing the inorganic contamination, thereby exposing the inorganic contamination (and possibly simultaneously modifying the inorganic contamination).

Subsequent to or simultaneous with removal of the top layer containing the inorganic contamination by the removal agent (thereby exposing the inorganic contamination) and subsequent to or simultaneously with removing the modified inorganic contamination, the SCF travels through valve 36 and conduit 38 to reservoir 12 which holds a solid, liquid, or gaseous modification agent(s). Possible modification agents are listed below. This is accomplished by closing valves 1, 3, and 5 and opening valves 2, 4, and 6. The passing of the SCF through the modification agent acts to incorporate the modification agent into the SCF. The SCF incorporated with the modification agent leaves reservoir 14 and enters chamber 16. The SCF mixture and the exposed inorganic contamination are introduced, thereby resulting in the modification of the inorganic contamination, which is situated on the surface of the sample (preferably a semiconductor wafer).

Subsequent to or simultaneous with the removal of the top layer (thereby exposing the inorganic contamination) and subsequent to or simultaneously with the modification of the inorganic contamination on the semiconductor sample by the modification agent, the SCF travels through valve 36 and conduit 38 to reservoir 14 which holds a solid, liquid, or gaseous solvent agent(s). Possible solvent agents are listed below. This is accomplished by closing valves 1, 3, 4, 6, and 9 and opening valves 2, 5, and 8. The passing of the SCF through the solvent agent acts to incorporate the solvent agent into the SCF. The SCF incorporated with the solvent agent leaves reservoir 14 and enters chamber 16. The SCF mixture and the exposed and modified inorganic contamination are introduced, thereby resulting in the removal of the exposed and modified inorganic contamination from the surface of the sample (preferably a semiconductor wafer).

The modified inorganic contaminant and the $CO_2$ are removed and passed through depressurization valve 18 such that the inorganic contaminant precipitates in container 20. The $CO_2$ gas is then recycled by pump 24 through line 26 to reservoir 28. The inorganic contaminants can be removed via line 22.

One embodiment of the instant invention is a method of removing inorganic (preferably metallic) contamination from within a native oxide layer or from between a underlying semiconductor layer and a layer of native oxide. Preferably, this method is comprised of the following steps. First, removing the native oxide (which is on the order of 30 thick) by subjecting it to a removal agent. Second, reacting the inorganic contamination with a conversion agent so as to convert the inorganic contamination (preferably in a more soluble form). The removal agent and the conversion agent may be comprised of the same elements. Third, removing the converted inorganic contamination with a solvent agent. The removal agent, the modification agent, and the solvent agent may be comprised of the same element(s) and may be administered simultaneously or sequentially.

The removal agent may be comprised of hydrofluoric acid. In addition, it may be introduced either by vapor exposure, plasma exposure, or by exposing the semiconductor wafer to a supercritical fluid (preferably $CO_2$) which contains HF. The conversion agent may be comprised of HF or it may include any other halogen-containing agent (preferably chlorine). The conversion agent may be introduced by vapor exposure to the wafer, plasma exposure to the wafer, or by exposing the wafer to a supercritical fluid (preferably $CO_2$) which includes the conversion agent. Preferably, the conversion agent is comprised of an acid (preferably KCN, HF, HCl, or KI), a base (preferably $NH_4OH$, KOH, or $NF_3$), a chelating agent (preferably dibetaketone), or a halogen-bearing agent (preferably CO, $NH_3$, NO, COS, $NH_4OH$, water, or $H_2O_2$). Preferably, the solvent agent may be comprised of a polar gas (preferably CO, COS, NO, $NH_3$, or $NF_3$), nonpolar gases (preferably $N_2$, $H_2$, $O_2$, or $F_2$), polar SCF (preferably $NO_2$), nonpolar SCF (preferably $CO_2$), a polar species (preferably water, ethanol, methanol, acetone, or glycol), a nonpolar species (preferably tetrahydrofuan, or dimethylformamide), surfactants, detergents, or amphoteric materials (preferably sodium dodecyl sulfate, quaternary ammonium salts, or cationic, anionic, nonionic or zwitterionic surfactants), or a chelating agent (preferably beta-diketone, fluorinated or unfluorinated crown ether), which is preferably included in a supercritical fluid (preferably $CO_2$).

Referring to FIGS. 2a–2d, the method of this embodiment is capable of removing inorganic contamination 104 that is situated on top of a native oxide 102, within the native oxide 102, or between native oxide 102 and underlying layer 100. This method can be utilized to remove the native oxide layer 102 (see FIGS. 2a and 2b), convert the inorganic contamination so that it is more soluble in a subsequent removal step (see FIGS. 2b and 2c where inorganic contamination 104 is modified to a more soluble inorganic contamination 106), and removing the converted inorganic contamination (see FIG. 2d). The conversion agent may be comprised of any agent that would make the inorganic contamination more soluble (or more easily removed) in a subsequent removal step. Therefore, the conversion agent may include a chelating agent. In addition, the removal of the native oxide and the conversion of the inorganic contamination may occur in one step.

The removal agent may or may not be included in a SCF, and the conversion agent may or may not be included in a SCF. In addition, the removal agent, the conversion agent, and the solvent agent may all be introduced at one time; or the removal agent and the conversion agent may be introduced together followed by the solvent agent; or the removal agent may be to introduced followed by the combination of the conversion agent and the solvent agent.

For example, assume that inorganic contamination 104 is comprised of sodium, and that this contamination is interdispersed throughout native oxide 102 (as depicted in FIG. 2a). In order to remove native oxide 102, HF is introduced to device 108. The HF can either be incorporated in a SCF or not. The result of this step is shown in FIG. 2b. Next, device 108 is exposed to HF (this may be done simultaneously with the previously mentioned step). This step results in the conversion/alteration of the sodium contamination. The result is NaF (referred to as contamination 106 in FIG. 2c). Next, device 108 is subjected to a solvent (water incorporated in supercritical $CO_2$) so as to remove the more soluble contamination 106. The result is shown in FIG. 2d, whereby both the native oxide and the contamination are removed.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of removing inorganic contamination from a layer overlying a substrate, said method comprising the steps of:
   removing said layer overlying said substrate with at least one removal agent;
   reacting said inorganic contamination having a first solubility in at least one solvent agent with at least one conversion agent to convert said inorganic contamination into a converted inorganic contamination which has a second solubility in said at least one solvent agent;
   removing said converted inorganic contamination having said second solubility in said at least one solvent agent by subjecting it to said at least one solvent agent, said solvent agent being included in a first supercritical fluid;
   and wherein said second solubility is greater than said first solubility in said at least one solvent agent.

2. The method of claim 1, wherein said conversion agent is selected from the group consisting of: an acid agent, a basic agent, a chelating agent, a ligand agent, a halogen-containing agent, and any combination thereof.

3. The method of claim 1, wherein said conversion agent is comprised of HF.

4. The method of claim 1, wherein said conversion agent is included in supercritical $CO_2$.

5. The method of claim 1, wherein said solvent agent is selected from the group consisting of a polar gas, a nonpolar gas, a polar supercritical fluid, a nonpolar supercritical fluid, a polar species, a nonpolar species, a surfactant, a detergent, a amphoteric material, and a chelating agent.

6. The method of claim 1, wherein said solvent agent is included in supercritical $CO_2$.

7. The method of claim 1, wherein said overlying layer is comprised of a native oxide.

8. The method of claim 1, wherein said steps of removing said layer overlying said substrate with said removal agent and reacting said inorganic contamination with said at least one conversion agent are performed simultaneously.

9. The method of claim 1, wherein said steps of removing said layer overlying said substrate with said removal agent, reacting said inorganic contamination with said at least one conversion agent, and removing said converted inorganic contamination are performed simultaneously.

10. The method of claim 1, wherein said step of removing said layer overlying said substrate with said removal agent is performed followed by the steps of reacting said inorganic contamination with said at least one conversion agent and removing said converted inorganic contamination, which are performed simultaneously.

11. The method of claim 1, wherein said removal agent is comprised of HF.

12. The method of claim 11, wherein said removal agent is included in a second supercritical fluid.

13. The method of claim 12, wherein said second supercritical fluid is comprised of supercritical $CO_2$.

14. A method of removing inorganic contamination from a layer overlying a substrate, said method comprising the steps of:

removing said layer overlying said substrate with at least one removal agent, said removal agent being included in a first supercritical fluid;

reacting said inorganic contamination having a first solubility in at least one solvent agent with at least one conversion agent to convert said inorganic contamination into a converted inorganic contamination which has a second solubility in said at least one solvent agent, said conversion agents being included in a second supercritical fluid;

removing said converted inorganic contamination having said second solubility by subjecting it to said at least one solvent agent, said solvent agent being included in a third supercritical fluid;

and wherein said second solubility is greater than said first solubility in said at least one solvent agent.

15. The method of claim 14, wherein said steps of removing said layer overlying said substrate with said removal agent and reacting said inorganic contamination with said at least one conversion agent are performed simultaneously.

16. The method of claim 14, wherein said steps of removing said layer overlying said substrate with said removal agent, reacting said inorganic contamination with said at least one conversion agent and removing said converted inorganic contamination are performed simultaneously.

17. The method of claim 14, wherein said step of removing said layer overlying said substrate with said removal agent is performed followed by the steps of reacting said inorganic contamination with said at least one conversion agent and removing said converted inorganic contamination, which are performed simultaneously.

* * * * *